United States Patent [19]

Hsu et al.

[11] 4,178,605
[45] Dec. 11, 1979

[54] COMPLEMENTARY MOS INVERTER STRUCTURE

[75] Inventors: Sheng T. Hsu, Lawrenceville, N.J.; James M. Cartwright, Jr., Cambria Heights, N.Y.

[73] Assignee: RCA Corp., New York, N.Y.

[21] Appl. No.: 873,593

[22] Filed: Jan. 30, 1978

[51] Int. Cl.² ............................................. H01L 27/02
[52] U.S. Cl. .................................... 357/42; 357/23
[58] Field of Search ................................... 357/23, 42

[56] References Cited

U.S. PATENT DOCUMENTS

| 3,436,622 | 4/1969 | Warner | 357/23 |
| 3,641,405 | 2/1972 | Brown et al. | 357/42 |
| 3,715,637 | 2/1973 | Polrier | 357/42 |
| 3,855,610 | 12/1974 | Masuda et al. | 357/23 |
| 3,872,491 | 3/1975 | Hanson et al. | 357/23 |
| 3,898,105 | 8/1975 | Mai et al. | 357/23 |
| 4,052,229 | 10/1977 | Pashley | 357/42 |
| 4,078,947 | 3/1978 | Johnson et al. | 357/42 |

*Primary Examiner*—Joseph E. Clawson, Jr.
*Attorney, Agent, or Firm*—H. Christoffersen; D. S. Cohen; L. P. Benjamin

[57] ABSTRACT

A complementary MOS inverter includes transistors each of which has a dual gate structure with the threshold voltage of the channel nearest the drain of each transistor arranged to be lower than that of the channel nearest the source of each transistor. This arrangement provides the cascode characteristics of dual gate structure, i.e., high breakdown voltage, high voltage gain, low drain output conductance, and relatively fast frequency response, but allows all four gate electrodes of the transistors to be connected in common, thus enabling relatively simple layout.

10 Claims, 10 Drawing Figures

COMPLEMENTARY MOS INVERTER STRUCTURE

This invention relates to semiconductor integrated circuit devices, particularly those devices of the type adapted for digital signal processing and employing insulated gate field effect transistors as the active elements thereof.

A basic building block in MOS digital integrated circuits is the complementary pair inverter. This circuit element is a series combination of an N channel and a P channel insulated gate field effect transistor. The sources of the two transistors are connected to supply voltage nodes or terminals and the drains are connected in common and to an output node. The gates of the two insulated gate field effect transistors are connected in common to an input node. In operation, with a relatively low voltage on the gates, the N channel transistor is off and the P channel transistor is on such that the output node is effectively connected to the relative high voltage supply node. With relatively high voltage on the gates, the N channel transistor is on and the P channel transistor is off so that the output is effectively connected to the low voltage supply node. The output is thus the inverse of the input.

Complementary inverters are fabricated either in what is known as bulk form, i.e. in a unitary body of semiconductive material, or they are made in semiconductive material which has the form of a layer-like body supported on an insulating substrate, commonly known as silicon-on-sapphire. Constructed in these ways, known inverter structures have heretofore been relatively limited in terms of breakdown voltage, voltage gain, and frequency response. A structure capable of higher breakdown voltage, higher voltage gain, and higher frequency response would be desirable for many applications. One such application would be devices for use in electronic watches where the improved frequency response would be most useful.

Transistor structures in the circuits described above have been of the basic type, including a source, a drain, a channel, and an insulated gate electrode over the channel. More complicated insulated gate field effect transistor structures are known in other general fields of application. For example, dual gate MOS field effect transistors are known and have been used in linear circuits. These devices have better characteristics than do single gate MOS transistors, but, as the name "dual gate" implies, these are four terminal devices, i.e., the source, the drain, and the two gates. One of the two gates is the control gate which receives the input signal and the other, usually called the second gate, receives a dc bias voltage. Owing to the presence of the second gate, the integration of such a transistor becomes relatively difficult and for this reason these transistors have heretofore been employed, usually, in discrete form. To combine two of these transistors in an inverter arrangement would introduce complications in layout which would make the device unsuitable for large scale integrated circuit applications.

Figure 1:
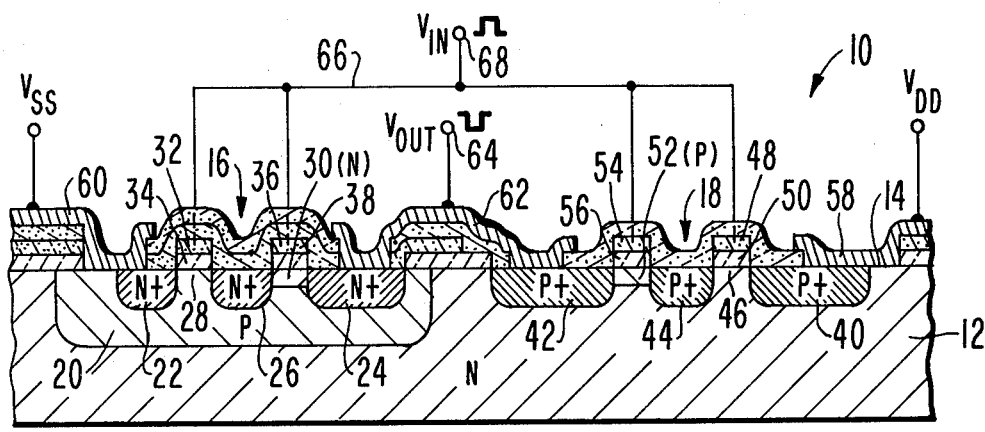
FIG. 1 is a diagrammatic, partial cross-sectional view of one embodiment of the present novel inverter structure.

One embodiment of the present inverter structure, shown partially in structural cross-section and partially diagrammatically, is indicated at 10 in FIG. 1. The structure 10 is embodied here in so-called bulk form. In this form, the structure 10 is fabricated in a unitary body 12 of semiconductor material, usually silicon, which has a surface 14 adjacent to which the active elements of the structure are formed. The active elements here are an N channel insulated gate field effect transistor means 16 and a P channel insulated gate field effect transistor means 18, each formed adjacent to the surface 14 of the body 12.

In this example, the N channel transistor 16 is formed within a localized region 20 of conductivity type opposite to that of the body 12. As in conventional MOS integrated circuits, the body 12 is initially of N type conductivity and the localized region 20, often called a P-well, is therefore of P-type conductivity. The P channel transistor 18 is formed outside the P-well 20. Unlike conventional circuits, however, each of the transistors 16 and 18 has the general form of a dual gate MOS transistor structure.

Referring to the N channel transistor 16, there is a source region 22 and a drain region 24. An intermediate drain-source region 26 located between the source region 22 and the drain region 24 defines, with the latter two regions, the ends of two channel regions 28 and 30. The first channel region 28 is always fabricated so as to have enhancement mode characteristics. A gate electrode 32 is positioned over the first channel region 28 and is separated therefrom by a gate insulator layer 34. The channel region 28 is characterized by having a predetermined threshold for conduction, i.e. a gate-to-source voltage of a predetermined positive amount at the onset of conduction.

Between the intermediate drain-source region 26 and the drain region 24 is the second channel region 30. Over this channel region is a gate electrode 36 separated from the channel region 30 by a gate insulator layer 38. The threshold for conduction of the channel region 30 is selected and fabricated to be lower than that of the channel region 28, i.e., in the N channel transistor 16, a threshold which is either less positive or negative in value. In the preferred embodiment here disclosed, the threshold for conduction of the second channel region 30 is chosen to be negative so that the channel is a depletion channel.

The P channel transistor 18 is constructed similarly to the N channel transistor 16 except for the inversion of conductivity types. Thus, there is a source region 40, a drain region 42 and an intermediate drain-source region 44. Between the source region 40 and the intermediate drain-source region 44 is a first channel region 46 controlled by a gate electrode 48 working through a gate insulator layer 50. Between the intermediate drain-source region 44 and the drain region 42 is a second channel region 52 controlled by a gate electrode 54 working through a gate insulator layer 56. The channel region 46 is characterized by enhancement characteristics with a predetermined threshold for conduction. The channel region 52 has a threshold for conduction lower than that of the enhancement channel region 46.

Here, what is meant by "lower" is less negative, or positive. As in the N channel transistor 16, the preferred form of the second channel region 52 in the transistor 18 is a depletion mode channel.

The transistors 16 and 18 are connected as follows to form a complementary inverter. Power supply connections are made to the sources of the two transistors. In particular, a contact metal layer 58 is connected to the source 40 of the P channel transistor 18 and to the material of the body 12, as is common practice in this art. The contact 58 serves to connect the source 40 and the body 12 to a first supply voltage $V_{DD}$. A contact metal layer 60 is connected to the source 22 of the N channel transistor 16 and to the P-well 20 to connect these elements to a second supply voltage $V_{SS}$. Metallization means 62 connects the drains 24 and 42 of the two transistors in common and to an output node 64. Means diagrammatically shown as a conductor 66 connects all four gate electrodes 32, 36, 54 and 48 in common to an input node 68. In practice, the conductor 66 may have the form of a single deposited conductor. Unlike known dual gate MOS structures in which separate signal and bias voltages are applied to the two gate electrodes, both gate electrodes of each transistor in the present device receive the same input voltages. The desirable cascode properties, i.e. higher breakdown voltage, higher gain and faster operation, which are typical of dual gate structures are nevertheless obtained in the present structure owing to the relative different threshold characteristics of the two channels of each device. The depletion mode channels 30 and 52 can be thought of as having a built-in bias supply. The advantage is that complicated metallization is not required in connecting the four gate electrodes together. Since signal voltages are applied to the gate electrodes nearest the drains, the present structure does sacrifice the low feedback capacitance advantage of known dual gate structures, but the other advantages sufficiently outweigh this disadvantage.

Figure 2:
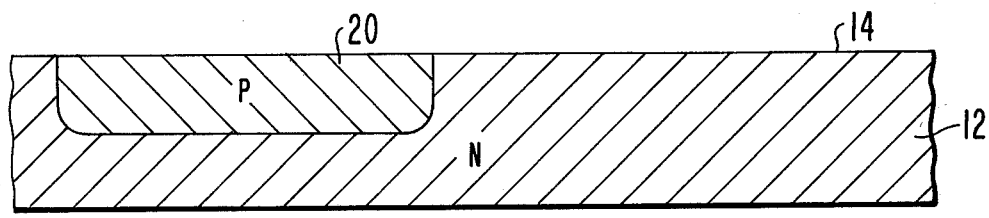
FIGS. 2-5 are a series of partial cross-sectional views illustrating a preferred method of making the structure of FIG. 1.

A preferred method for constructing the structure 10 is illustrated in FIGS. 2–5. As illustrated in FIG. 2, the process begins in the same manner as for a conventional inverter structure with a body 12 of N type conductivity with its surface 14. An early step in the process is to form the P-well 20 and this may be accomplished by diffusion, etch and refill, ion implantation or any other method known to the art. The relative conductivities of the body 12 and the P-well 20 may be those ordinarily used in these devices.

Figure 3:
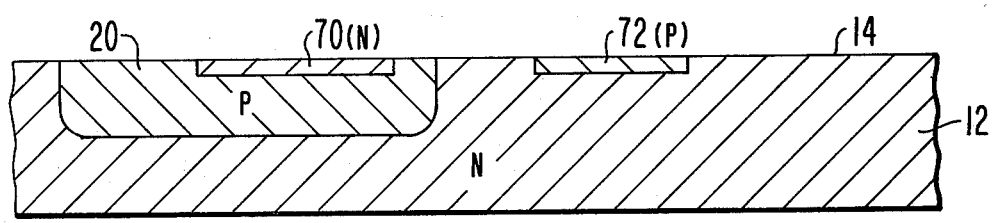

After the formation of the P-well 20, the surface 14 of the body 12 is prepared for the introduction of conductivity modifiers into localized zones of the body 12. As shown in FIG. 3, N-type conductivity modifiers are introduced into a localized region 70 within the P-well 20. P-type impurities are introduced into a localized region 72 outside the P-well 20. Preferably, these introduction steps are accomplished by ion implantation in which the surface 14 is first masked for the introduction of one of the regions 70 and 72, implantation is carried out, and the surface is then remasked for the introduction of the other of the regions 70 and 72. The energy and doses of the two ion implantation steps is chosen with consideration of the background doping in the body 12 and the P-well 20, so as to produce modifier concentrations appropriate for the channels 30 and 52, which a portion of each of these regions 70 and 72 will become.

Figure 4:
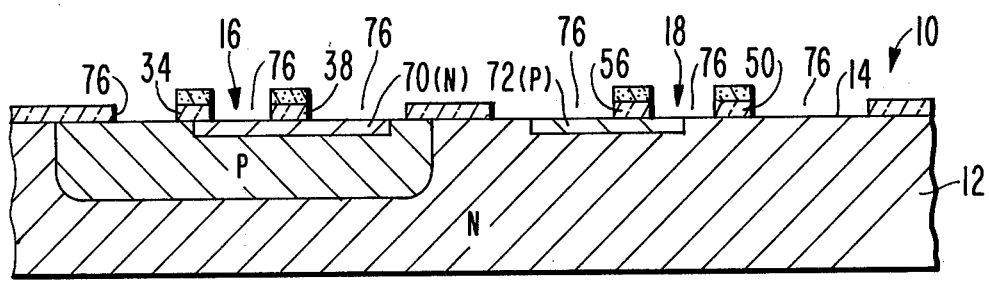

The next essential steps in the present preferred process are those required to form the gate insulator layers 34, 38, 56, and 50 and the gate electrodes 32, 36, 54 and 48. To this end, the surface 14 is next treated in known manner to produce a continuous silicon dioxide layer (not shown as such) portions of which will become the respective gate insulator layers 34, 38, 56 and 50. The silicon dioxide layer 74 is shown in FIG. 4 in its form subsequent to the formation of a plurality of apertures 76 at predetermined locations therein. In addition, gate electrode means, preferably of polycrystalline silicon, are shown in place over the respective gate insulator layers. The combination of the gate electrode structures and other remaining portions of the silicon dioxide layer 74 define the locations of the apertures 76 and expose the surface 14 over the areas to be intercepted by the various sources, drains, and intermediate drain-source regions of the two transistors. The steps leading to the configuration of FIG. 4 are substantially the same as those employed in known self-aligned silicon gate technology. The difference is in the presence of localized regions 70 and 72 and their arrangement as shown to overlap the areas where the respective drains and intermediate drain-source regions of the two transistors are to be formed.

Figure 5:
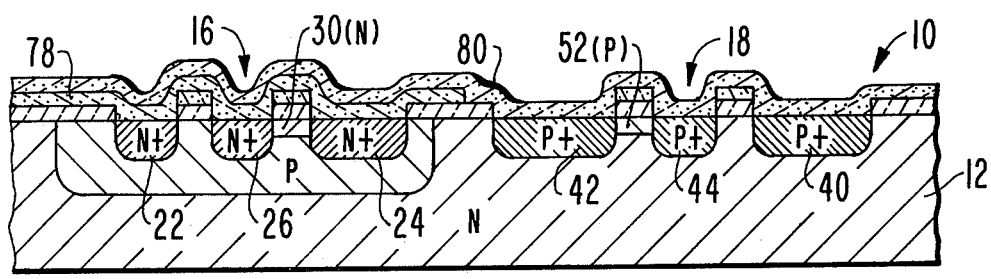

The next steps, illustrated in FIG. 5, are for the purpose of forming the various sources, intermediate drain-source, and drain regions. To this end, the structure as shown in FIG. 4 is first subjected to the deposition of a doped oxide layer 78 containing, in this example, phosphorus as a donor impurity. Standard photolithographic procedures are employed to remove portions of the doped oxide layer 78 from the areas overlying the P channel transistor 18.

A second doped oxide layer 80 is then deposited over the entire upper surface of the structure 10. Although not shown as such, this layer 80 is preferably a dual layer structure having a lower, boron doped layer and a top, undoped capping layer. After the deposition of the layers 78 and 80, the structure 10 is heated to diffuse donor and acceptor impurities into the body 12 to form, simultaneously, the regions 22, 26, 24, 42, 44 and 40. This doped oxide process in itself is generally conventional and other processes such as standard-source diffusion processes or ion implantation may also be used to form these regions. The essential feature is that the locations for the regions 26 and 24 be chosen to overlap the pre-established region 70 so as to establish contact with the channel 30 and that the locations of the regions 42 and 44 be chosen to overlap the localized regions 72 to establish contact with the channel 52.

The structure 10 is then completed in standard manner by forming openings in the doped oxide layers 78 and 80 at the locations for the various contacts, after which conventional metallization steps are carried out to form the various conductors 60, 62, and 58 shown in FIG. 1.

The device 10, constructed and fabricated as described above, may be used in digital signal processing circuits in the same manner as prior inverter structures have been used. Owing to the construction of the two transistors, however, and the cascode properties thereof, namely, higher breakdown voltage, higher voltage gain, and faster frequency response, the structure 10 has improved performance characteristics. Moreover, even though the structure of each of the transistors 16 and 18 is complicated by the presence of two gate electrodes, the interconnection of the two transistors is no more complicated than in prior single gate structures, owing to the different threshold characteristics of the two channels of each transistor and the interconnection of all four gate electrodes to receive the same input voltage.

Another common form of MOS integrated circuit device is the so-called silicon-on-sapphire form and the present novel structure can be fabricated in this manner as well. A silicon-on-sapphire embodiment of this structure is indicated generally at 82 in FIG. 6. The structure 82 includes an insulating substrate body 84, usually of sapphire (although various forms of spinel are also suitable), which has a surface 86 adjacent to which the active elements are formed. In this example, there is an N channel transistor 88 and a P channel transistor 90. Each of these transistors is formed in an island, 92 and 94 respectively, of silicon which is epitaxially related to the substrate 84.

Referring to the N channel transistor 88, there is an N+ type source region 96, an N+ type drain region 98, and an intermediate N+ type drain-source region 100. Between the source region 96 and the intermediate drain-source region 100 is a first channel region 102 controlled by a gate electrode 104 working through a gate insulator layer 106. Between the intermediate drain-source region 100 and the drain region 98 is a second channel region 108 controlled by a gate electrode 110 working through a gate insulator layer 112. In this example, the channel region 102 is characterized by enhancement characteristics, i.e., it is P type, and the channel region 108 is characterized by depletion characteristics, i.e. it is N type, in a relationship similar to that described for the bulk example above.

The P channel transistor 90 has a P+ type source region 114, a P+ type drain region 116, a P+ type intermediate drain-source region 118, a first channel region 120, and a second channel region 122. The first channel region 120 is controlled by a gate electrode 124 working through a gate insulator layer 126. The channel 122 is controlled by a gate electrode 128 working through a gate insulator layer 130. In this transistor, the channel region 120 is N type to have enhancement characteristics and the channel region 122 is P type to have depletion characteristics.

Power supply connections are made to the sources of the two transistors by a contact metal layer 132 between the source 114 of the transistor 90 and the $V_{DD}$ supply and a contact metal layer 134 between the source 96 of the transistor 88 and the $V_{SS}$ supply. Metallization means 136 connects the drains 98 and 116 of the two transistors in common and to an output node 138. A conductor 140 connects all four gate electrodes 104, 110, 128, and 135 in common to an input node 142.

The structure 82 has characteristics and advantages similar to those of the bulk structure described above as well as the additional speed advantages ordinarily associated with the silicon-on-sapphire construction.

A preferred method for constructing the structure 82 is illustrated in FIGS. 7–10. The process begins with the structure shown in FIG. 7, which is the substrate 84, having the islands 92 and 94 formed thereon in conventional manner. In this example, both islands 92 and 94 are initially of P-type conductivity.

Figure 7:
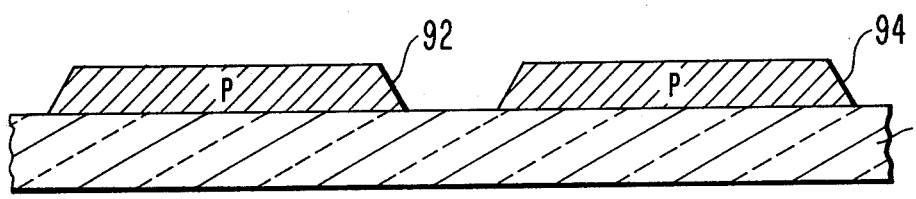
FIGS. 7-10 are a series of partial cross-sectional views illustrating a preferred method of making the structure of FIG. 6.
Figure 8:
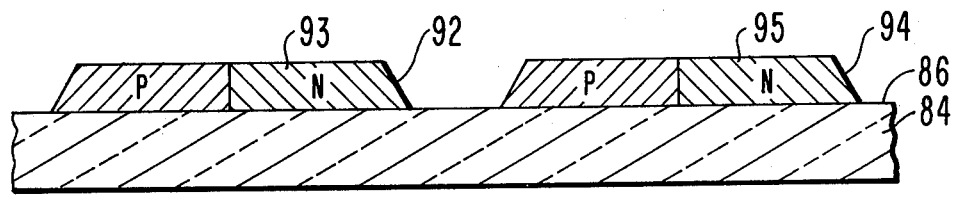

Next, the structure shown in FIG. 7 is conventionally photo-masked for the introduction of conductivity modifiers into the islands 92 and 94. In this example, the left side portions of the two islands are protected and donor impurities are introduced into the right hand portions, 93 and 95 respectively, of each of the islands to convert those portions to N type conductivity. The silicon-on-sapphire process is simpler in this respect than the bulk process described above since ion implantation of only one type of modifier is necessary.

Figure 9:
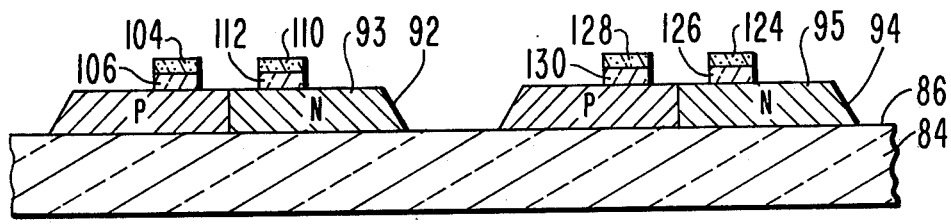

Gate electrode structures are next formed on the islands 92 and 94 in the positions shown in FIG. 9. This may be conventionally accomplished by thermally oxidizing the material of the islands 92 and 94; depositing a layer of polycrystalline silicon; and then photolithographically defining these materials to form the gate insulator layers 106, 112, 130, and 126 and the gate electrodes 104, 110, 128, and 124.

Figure 10:
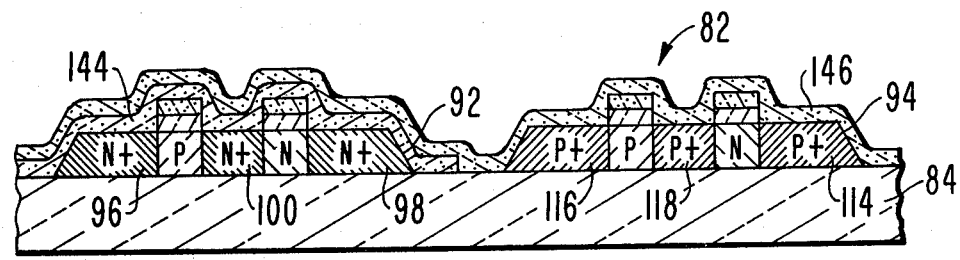

Next, a doped oxide layer 144 containing donor impurities, like the doped oxide layer 78 of the bulk structure 10, is deposited and defined (see FIG. 10). A doped oxide layer 146 containing boron like the doped oxide layer 80 of the bulk structure 10 is next deposited after which the structure 82 is heated to diffuse impurities from the doped oxide layers 144 and 146 into the islands 92 and 94 to form the various regions 96, 100, 98, 116, 118, and 114. The locations of the gate electrode structures determine the locations of these regions and are chosen such that the intermediate drain-source regions 100 and 118 overlap the junction between the left hand P type material of each island of the right hand N type material thereof. Thus, the series combination of an enhancement and a depletion transistor within each of the transistors 88 and 90 is achieved.

Figure 6:
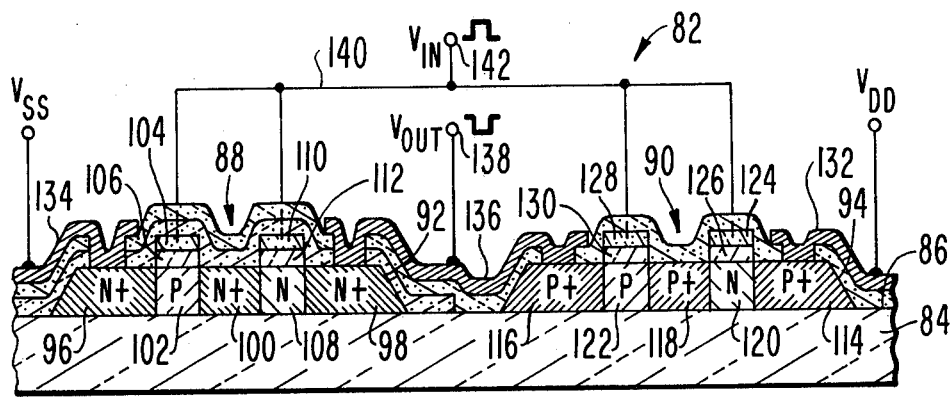
FIG. 6 is a diagrammatic, partial cross-sectional view of another embodiment of the present inverter structure.

The structure 82 is completed by conventional contact opening and metallization steps to form the structure shown in FIG. 6.

What is claimed is:

1. An improved complementary MOS inverter structure having N channel insulated gate field effect transistor means with source, drain, channel, and gate electrode means; P channel insulated gate field effect transistor means with source, drain, channel, and gate electrode means; means for applying a first supply voltage to the source of the P channel insulated gate field effect transistor means; means for applying a second supply voltage to the source of the N channel insulated gate field effect transistor means; means for connecting the drains of the N and P channel insulated gate field effect transistor means in common; and means for connecting the gate electrode means of the N and P channel insulated gate field effect transistor means in common, wherein the improvement comprises:

each of said N and P channel insulated gate field effect transistor means comprising a series combination of an enhancement channel having a predetermined threshold for conduction and a channel having a threshold for conduction lower than that of the enhancement channel, the lower threshold channel of each insulated gate field effect transistor means being adjacent the respective drain thereof.

2. A complementary MOS inverter structure as defined in claim 1 wherein:

said lower threshold channel of each of said insulated gate field effect transistor means is a depletion channel.

3. A complementary MOS inverter structure as defined in claim 1, formed from a unitary body of semiconductive material of one type conductivity having a surface, said body having a localized region of the opposite type conductivity adjacent to said surface, one of said MOS insulated gate field effect transistor means being within said localized region and the other of said insulated gate field effect transistor means being outside said localized region.

4. A complementary MOS inverter structure as defined in claim 3 wherein said lower threshold channel of each of said insulated gate field effect transistor means is a depletion channel.

5. A complementary MOS inverter structure as defined in claim 4 wherein each of said insulated gate field effect transistor means comprises
 a source region,
 a first channel adjacent to said source region,
 an intermediate common drain-source region next adjacent to said first channel,
 a second channel next adjacent said intermediate common drain-source region, and
 a drain region next adjacent said second channel.

6. A complementary MOS inverter structure as defined in claim 3 wherein said body is of N type silicon and said localized region is P type.

7. A complementary MOS inverter structure as defined in claim 1 formed from a layer-like body of semiconductive material on an insulating substrate.

8. A complementary MOS inverter structure as defined in claim 7 wherein said semiconductive material is silicon and said insulating substrate is sapphire.

9. A complementary MOS inverter structure as defined in claim 8 wherein said lower threshold channel of each of said insulated gate field effect transistor means is a depletion channel.

10. A complementary MOS inverter structure as defined in claim 9 wherein each of said insulated gate field effect transistor means comprises
 a source region,
 a first channel adjacent to said source region,
 an intermediate common drain-source region next adjacent to said first channel,
 a second channel next adjacent said intermediate common drain-source region, and
 a drain region next adjacent said second channel.

* * * * *